United States Patent
Chen et al.

(10) Patent No.: US 9,444,005 B2
(45) Date of Patent: Sep. 13, 2016

(54) LIGHT EMITTING DIODE STRUCTURE

(71) Applicant: Lextar Electronics Corporation, Hsinchu (TW)

(72) Inventors: Bo-Yu Chen, Hsinchu (TW); Po-Hung Tsou, New Taipei (TW); Tzu-Hung Chou, Zhongli (TW)

(73) Assignee: LEXTAR ELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 14/816,129

(22) Filed: Aug. 3, 2015

(65) Prior Publication Data
US 2015/0340556 A1 Nov. 26, 2015

Related U.S. Application Data

(62) Division of application No. 14/228,319, filed on Mar. 28, 2014, now Pat. No. 9,117,959.

(30) Foreign Application Priority Data

Jul. 30, 2013 (TW) .............................. 102127278 A

(51) Int. Cl.
*H01L 33/14* (2010.01)
*H01L 33/42* (2010.01)
*H01L 33/38* (2010.01)

(52) U.S. Cl.
CPC .............. *H01L 33/145* (2013.01); *H01L 33/14* (2013.01); *H01L 33/42* (2013.01); *H01L 33/38* (2013.01)

(58) Field of Classification Search
CPC .............................. H01L 33/145; H01L 33/42
See application file for complete search history.

(56) References Cited

U.S. PATENT DOCUMENTS 4,893,313 A * 1/1990 Hatakoshi ........... H01S 5/32325
257/615
5,219,785 A  6/1993 Welch et al.
(Continued)

FOREIGN PATENT DOCUMENTS

CN    102751410 A    10/2012
EP      087745 B1     7/2010
(Continued)

OTHER PUBLICATIONS

EP Search Report dated Sep. 29, 2014.
(Continued)

*Primary Examiner* — Ida M Soward
(74) *Attorney, Agent, or Firm* — McClure, Qualey & Rodack, LLP

(57) ABSTRACT

A light emitting diode structure is provided. The light emitting diode structure includes a substrate, a light emitting multi-layer structure, a first current blocking layer, a first current spreading layer, a second current blocking layer and a second current spreading layer. The light emitting multi-layer structure is formed on the substrate by way of stacking. The first current blocking layer is formed on part of the light emitting multi-layer structure. The first current spreading layer covers the first current blocking layer and the light emitting multi-layer structure. The second current blocking layer is formed on part of the first current spreading layer. An orthogonal projection of the second current blocking layer is disposed in an orthogonal projection of the first current blocking layer. The second current spreading layer covers the second current blocking layer and the first current spreading layer.

8 Claims, 1 Drawing Sheet

(56) References Cited

U.S. PATENT DOCUMENTS

| | | | |
|---|---|---|---|
| 5,394,421 A * | 2/1995 | Ikawa | B82Y 20/00 372/44.01 |
| 5,981,978 A * | 11/1999 | Mushiage | H01L 33/0045 257/79 |
| 6,486,500 B1 * | 11/2002 | Chen | H01L 33/0033 257/79 |
| 6,573,114 B1 | 6/2003 | Shibata et al. | |
| 6,614,055 B1 | 9/2003 | Kusuda et al. | |
| 6,841,410 B2 | 1/2005 | Sasaoka | |
| 7,314,672 B2 | 1/2008 | Kimura | |
| 7,829,904 B2 | 11/2010 | Coffa et al. | |
| 8,017,953 B2 | 9/2011 | Hahn et al. | |
| 8,097,897 B2 | 1/2012 | Chuang et al. | |
| 8,624,278 B2 | 1/2014 | Park | |
| 8,637,891 B2 * | 1/2014 | Lester | H01L 33/38 257/79 |
| 8,669,586 B2 | 3/2014 | Hwang et al. | |
| 2006/0138439 A1 | 6/2006 | Bogner et al. | |
| 2007/0114545 A1 | 5/2007 | Jang et al. | |
| 2007/0145381 A1 | 6/2007 | Unno et al. | |
| 2008/0157115 A1 * | 7/2008 | Chuang | H01L 33/10 257/99 |
| 2010/0032701 A1 | 2/2010 | Fudeta | |
| 2010/0167434 A1 | 7/2010 | Fang et al. | |
| 2012/0138991 A1 * | 6/2012 | Chuang | H01L 33/10 257/98 |
| 2012/0223356 A1 | 9/2012 | Suzuki | |
| 2012/0280258 A1 | 11/2012 | Yeh et al. | |
| 2013/0032776 A1 | 2/2013 | Chen | |
| 2013/0168637 A1 | 7/2013 | Teranishi et al. | |
| 2013/0285095 A1 | 10/2013 | Moon | |
| 2015/0236215 A1 * | 8/2015 | Park | H01L 33/387 257/98 |

FOREIGN PATENT DOCUMENTS

| | | |
|---|---|---|
| EP | 0877455 B1 | 7/2010 |
| JP | 2005235802 A | 9/2005 |
| JP | 2007149966 A | 6/2007 |
| TW | 201320396 A1 | 5/2013 |

OTHER PUBLICATIONS

English Abstract translation of CN102751410 (Published Oct. 24, 2012).

English Abstract translation of JP2007149966 (Published Jun. 14, 2007).

English Abstract translation of JP2005235802 (Published Sep. 2, 2005).

TW Office Action dated Sep. 2, 2014.

English Abstract translation of TW201320396 (Published May 16, 2013).

* cited by examiner

LIGHT EMITTING DIODE STRUCTURE

This application is a divisional application of U.S. application Ser. No. 14/228,319, now U.S. Pat. No. 9,117,959, filed Mar. 28, 2014, which claims the benefit of Taiwan application Serial No. 102127278, filed Jul. 30, 2013, the subject matter of which is incorporated herein by reference.

BACKGROUND OF THE INVENTION

1. Field of the Invention

The invention relates in general to a diode structure, and more particularly to a light emitting diode structure with multiple current blocking layers.

2. Description of the Related Art

Normally, the current direction of a light emitting diode is the shortest path through which most of the current flows to the area under electrodes. Consequentially, most of the light concentrates under the electrodes and becomes blocked, and the brightness is thus decreased.

Currently, a single-layer current blocking layer is used to block the current from flowing to the shortest path, so that the current of the light emitting diode flows towards other paths to improve the distribution of current. Then, a current spreading layer covers the current blocking layer so as to increase the brightness and improve the brightness of elements.

Conventionally, a thickness of the current blocking layer is increased to facilitate the spreading of the current. However, in subsequent process of covering the current blocking layer with a current spreading layer, the current spreading layer may become too thin and break easily at the part with step coverage. Besides, when the thickness of the current spreading layer reaches a certain level (such as above 600 Å), the current spreading layer may absorb the light and result in light emitting loss, therefore the current spreading layer with a smaller thickness is used. However, when the current spreading layer is too thin, the current spreading layer may easily break at the part with step coverage, impeding the spreading of the current and incapacitating the normal operation of the light emitting diode.

SUMMARY OF THE INVENTION

The invention is directed to a light emitting diode structure. Through a covering design using multiple layers, the light emitting diode structure of the invention resolves the problem that a current spreading layer covering a current blocking layer may easily break at the part with step coverage when a thickness of the current blocking layer increases, avoids the spreading of the current being impeded, increases the effect of the current blocking layer and effectively improves the yield rate of products.

According to one embodiment of the present invention, a light emitting diode structure is provided. The light emitting diode structure comprises a substrate, a light emitting multi-layer structure, a first current blocking layer, a first current spreading layer, a second current blocking layer and a second current spreading layer. The light emitting multi-layer structure is formed on the substrate by way of stacking. The first current blocking layer is formed on part of the light emitting multi-layer structure. The first current spreading layer covers the first current blocking layer and the light emitting multi-layer structure. The second current blocking layer is formed on part of the first current spreading layer. An orthogonal projection of the second current blocking layer is disposed in an orthogonal projection of the first current blocking layer. The second current spreading layer covers the second current blocking layer and the first current spreading layer.

According to another embodiment of the present invention, a light emitting diode structure is provided. The light emitting diode structure comprises a substrate, a light emitting multi-layer structure, a first current blocking layer, a second current blocking layer and a first current spreading layer. The light emitting multi-layer structure is formed on the substrate by way of stacking. The first current blocking layer is formed on part of the light emitting multi-layer structure. The second current blocking layer is formed on part of the first current blocking layer. The first current spreading layer covers the first current blocking layer, the second current blocking layer and the light emitting multi-layer structure.

The above and other aspects of the invention will become better understood with regard to the following detailed description of the preferred but non-limiting embodiment(s). The following description is made with reference to the accompanying drawings.

DETAILED DESCRIPTION OF THE INVENTION

First Embodiment

Figure 1:
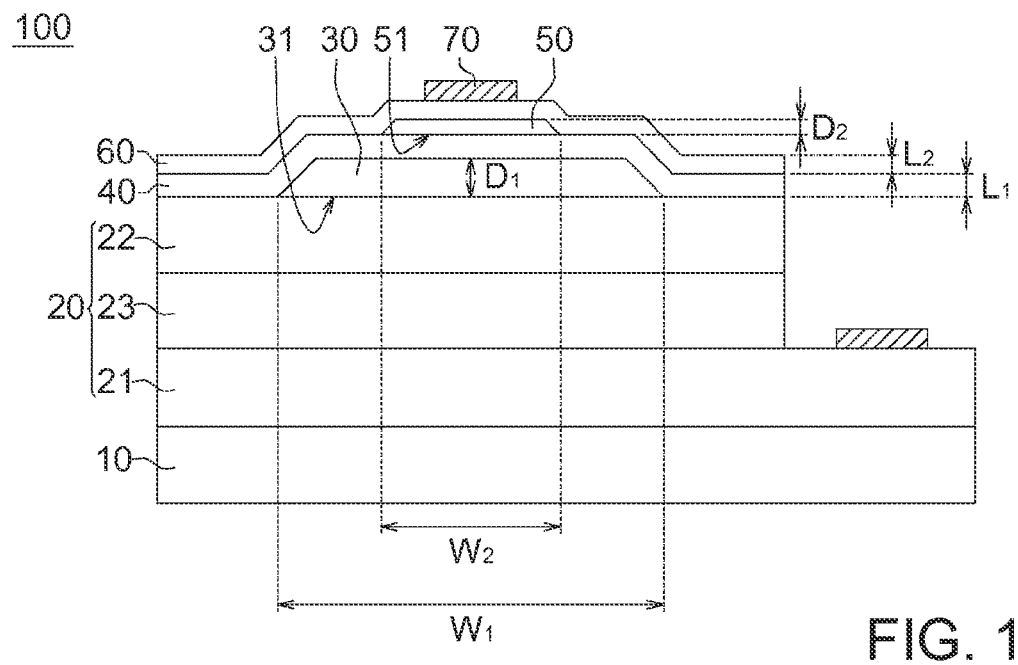
FIG. 1 is a cross-sectional view of a light emitting diode structure according to a first embodiment of the present invention.

FIG. 1 is a cross-sectional view of a light emitting diode structure 100 according to a first embodiment of the present invention. The light emitting diode structure 100 comprises a substrate 10, a light emitting multi-layer structure 20, a first current blocking layer 30, a first current spreading layer 40, a second current blocking layer 50 and a second current spreading layer 60. The light emitting multi-layer structure 20 is formed on the substrate 10 by way of stacking. The first current blocking layer 30 is formed on part of the light emitting multi-layer structure 20. The first current spreading layer 40 covers the first current blocking layer 30 and the light emitting multi-layer structure 20. The second current blocking layer 50 is formed on part of the first current spreading layer 40, and an orthogonal projection of the second current blocking layer 50 is disposed in an orthogonal projection of the first current blocking layer 30. Here, the orthogonal projection refers to a projection orthogonal to a top surface of the substrate 10. The second current spreading layer 60 covers the second current blocking layer 50 and the first current spreading layer 40.

As illustrated in FIG. 1, an area of the second current blocking layer 50 can be smaller than that of the first current blocking layer 30. That is, the areas of the top side (the upper surface) and the bottom side (the lower surface) of the second current blocking layer 50 both are smaller than that of the first current blocking layer 30. The lower surface 31 of the first current blocking layer 30 contacting the light emitting multi-layer structure 20 has a width W1, and the lower surface 51 of the second current blocking layer 50 contacting the first current spreading layer 40 has a width W2, wherein 0<W2<W1. Besides, the thickness D1 of the first current blocking layer 30 is thicker than the thickness D2 of the second current blocking layer 50. For instance, the thickness D2 of the second current blocking layer 50 is ⅓~½ times of the thickness D1 of the first current blocking layer 30.

The first current blocking layer 30 and the second current blocking layer 50 can be formed by silicon dioxide ($SiO_2$), and the first current spreading layer 40 and the second current spreading layer 60 can be formed by indium tin oxide (ITO). As illustrated in FIG. 1, the thickness L1 of the first current spreading layer 40 is thicker than the thickness L2 of the second current spreading layer 60.

In an embodiment, the light emitting multi-layer structure 20 may comprise a first type semiconductor 21, a light emitting layer 23 and a second type semiconductor 22. For example, the first type semiconductor 21 may be formed by N—GaN, and the second type semiconductor 22 may be formed by P—GaN. In addition, the light emitting diode structure 100 may further comprise a first electrode 70 formed on the second current spreading layer 60 and located above an orthogonal projection of the second current blocking layer 50.

Second Embodiment

Figure 2:
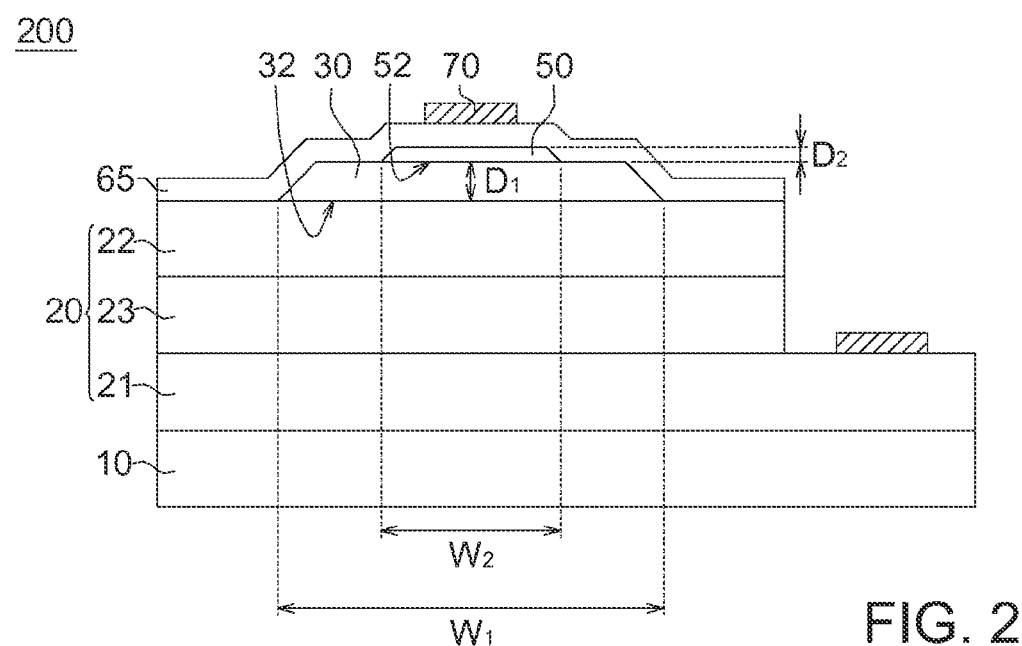
FIG. 2 is a cross-sectional view of a light emitting diode structure according to a second embodiment of the present invention.

FIG. 2 is a cross-sectional view of a light emitting diode structure 200 according to a second embodiment of the present invention. The light emitting diode structure 200 of the present embodiment is different from the light emitting diode structure 100 of the first embodiment in the quantity of the current spreading layer, and components common to FIG. 1 and FIG. 2 retain the same numeric designation.

The light emitting diode structure 200 comprises a substrate 10, a light emitting multi-layer structure 20, a first current blocking layer 30, a second current blocking layer 50 and a first current spreading layer 65. The light emitting multi-layer structure 20 is formed on the substrate 10 by way of stacking. The first current blocking layer 30 is formed on part of the light emitting multi-layer structure 20. The second current blocking layer 50 is formed on part of the first current blocking layer 30. The first current spreading layer 65 covers the first current blocking layer 30, the second current blocking layer 50 and the light emitting multi-layer structure 20.

As illustrated in FIG. 2, an area of the second current blocking layer 50 can be smaller than that of the first current blocking layer 30. The lower surface 32 of the first current blocking layer 30 contacting the light emitting multi-layer structure 20 has a width W1, and the lower surface 52 of the second current blocking layer 50 contacting the first current blocking layer 30 has a width W2, wherein 0<W2<W1. Besides, the thickness D1 of the first current blocking layer 30 is thicker than the thickness D2 of the second current blocking layer 50. For instance, the thickness D2 of the second current blocking layer 50 can be ⅓~½ times of the thickness D1 of the first current blocking layer 30.

The light emitting diode structure comprises one first current blocking layer 30 and one second current blocking layer 50 in the above embodiments, but the quantity of current blocking layers in the invention is not limited. Instead, the current blocking layer of the embodiments of the invention can have multiple layers, and the higher layer the current blocking layer (closer to the substrate 10), the smaller the area of orthogonal projection on the substrate 10. Moreover, an area of orthogonal projection of the topmost current blocking layer must be larger than that of the first electrode 70.

Furthermore, the method for manufacturing the light emitting diode structure of the embodiments of the invention comprises following steps. A substrate is provided. A light emitting multi-layer structure, a first current blocking layer and a second current blocking layer are stacked on the substrate in sequence. A current spreading layer covering the first current blocking layer, the second current blocking layer and the light emitting multi-layer structure is disposed.

It can be understood that if another current spreading layer is disposed between the first current blocking layer and the second current blocking layer in the structure similar to the structure of the first embodiment, the current spreading layer covers the first current blocking layer and the light emitting multi-layer structure.

While the invention has been described by way of example and in terms of the embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode structure, comprising:
   a substrate;
   a light emitting multi-layer structure formed on the substrate by way of stacking;
   a first current blocking layer formed on part of the light emitting multi-layer structure;
   a first current spreading layer covering the first current blocking layer and the light emitting multi-layer structure; and
   a second current blocking layer formed on part of the first current spreading layer, wherein an orthogonal projection of the second current blocking layer is disposed in an orthogonal projection of the first current blocking layer; and
   a second current spreading layer covering the second current blocking layer and the first current spreading layer.

2. The light emitting diode structure according to claim 1, wherein an area of the second current blocking layer is smaller than an area of the first current blocking layer.

3. The light emitting diode structure according to claim 2, wherein the lower surface of the first current blocking layer contacting the light emitting multi-layer structure has a width W1, the lower surface of the second current blocking layer contacting the first current spreading layer has a width W2, and 0<W2<W1.

4. The light emitting diode structure according to claim 3, wherein the first current blocking layer and the second current blocking layer both are formed by silicon dioxide ($SiO_2$), and the first current spreading layer is formed by indium tin oxide (ITO).

5. The light emitting diode structure according to claim 3, wherein the thickness of the first current blocking layer is thicker than the thickness of the second current blocking layer.

6. The light emitting diode structure according to claim 5, wherein the thickness of the first current spreading layer is thicker than the thickness of the second current spreading layer.

7. The light emitting diode structure according to claim 1, wherein the light emitting multi-layer structure comprises a first type semiconductor, a light emitting layer and a second type semiconductor.

8. The light emitting diode structure according to claim 7, further comprising a first electrode formed on the second current spreading layer and located above the orthogonal projection of the second current blocking layer.

* * * * *